US007618850B2

(12) United States Patent
Kumar et al.

(10) Patent No.: US 7,618,850 B2
(45) Date of Patent: Nov. 17, 2009

(54) METHOD OF MAKING A DIODE READ/WRITE MEMORY CELL IN A PROGRAMMED STATE

(75) Inventors: Tanmay Kumar, Pleasanton, CA (US); S. Brad Herner, Palo Alto, CA (US)

(73) Assignee: SanDisk 3D LLC, Milpitas, CA (US)

( * ) Notice: Subject to any disclaimer, the term of this patent is extended or adjusted under 35 U.S.C. 154(b) by 81 days.

(21) Appl. No.: 11/693,845

(22) Filed: Mar. 30, 2007

(65) Prior Publication Data

US 2007/0164309 A1   Jul. 19, 2007

Related U.S. Application Data

(60) Continuation-in-part of application No. 10/955,549, filed on Sep. 29, 2004, which is a continuation-in-part of application No. 10/855,784, filed on May 26, 2004, now Pat. No. 6,952,030, which is a continuation-in-part of application No. 10/326,470, filed on Dec. 19, 2002, now abandoned, application No. 11/693,845, which is a continuation-in-part of application No. 11/496,986, filed on Jul. 31, 2006, which is a continuation-in-part of application No. 11/237,167, filed on Sep. 28, 2005, application No. 11/693,845, which is a continuation-in-part of application No. 11/613,151, filed on Dec. 19, 2006, which is a division of application No. 10/954,510, filed on Sep. 29, 2004, now Pat. No. 7,176,064, which is a continuation-in-part of application No. 10/728,230, filed on Dec. 3, 2003, now Pat. No. 6,946,719.

(51) Int. Cl.
*H01L 21/82* (2006.01)

(52) U.S. Cl. .............. 438/131; 438/128; 438/130; 438/328; 438/467; 365/105; 257/E27.02; 257/296

(58) Field of Classification Search ............... 438/131, 438/328, 128, 130; 365/105, 103; 257/E27.02, 257/296, 208
See application file for complete search history.

(56) References Cited

U.S. PATENT DOCUMENTS

| 4,646,266 A | 2/1987 | Ovshinsky et al. |
| 4,665,428 A | 5/1987 | Hockley et al. |
| 5,166,760 A | 11/1992 | Mori et al. |
| 5,432,729 A | 7/1995 | Carson et al. |
| 5,559,732 A | 9/1996 | Birge |
| 5,693,556 A | 12/1997 | Cleeves |
| 5,745,407 A | 4/1998 | Levy et al. |
| 5,751,012 A | 5/1998 | Wolstenholme et al. |
| 5,835,396 A | 11/1998 | Zhang |

(Continued)

FOREIGN PATENT DOCUMENTS

EP    1 450 373    8/2004

(Continued)

OTHER PUBLICATIONS

U.S. Appl. No. 10/815,312, filed Apr. 1, 2004, Chen.

(Continued)

*Primary Examiner*—N Drew Richards
*Assistant Examiner*—Mamadou Diallo
(74) *Attorney, Agent, or Firm*—Foley & Lardner LLP

(57) ABSTRACT

A method of making a nonvolatile memory device includes fabricating a diode in a low resistivity, programmed state without an electrical programming step. The memory device includes at least one memory cell. The memory cell is constituted by the diode and electrically conductive electrodes contacting the diode.

21 Claims, 13 Drawing Sheets

U.S. PATENT DOCUMENTS

| | | | |
|---|---|---|---|
| 5,915,167 | A | 6/1999 | Leedy |
| 5,962,911 | A | 10/1999 | Manley |
| 5,991,193 | A | 11/1999 | Gallagher et al. |
| 6,014,330 | A | 1/2000 | Endoh et al. |
| 6,034,882 | A | 3/2000 | Johnson et al. |
| 6,111,784 | A | 8/2000 | Nishimura et al. |
| 6,187,617 | B1 | 2/2001 | Gauthier et al. |
| 6,236,587 | B1 | 5/2001 | Gudesen et al. |
| 6,306,718 | B1 | 10/2001 | Singh et al. |
| 6,420,215 | B1 | 7/2002 | Knall et al. |
| 6,483,736 | B2 | 11/2002 | Johnson et al. |
| 6,486,065 | B2 | 11/2002 | Vyvoda et al. |
| 6,525,953 | B1 | 2/2003 | Johnson |
| 6,541,312 | B2 | 4/2003 | Cleeves et al. |
| 6,567,301 | B2 | 5/2003 | Anthony et al. |
| 6,584,029 | B2 | 6/2003 | Tran et al. |
| 6,677,220 | B2 | 1/2004 | Van Brocklin et al. |
| 6,693,823 | B2 | 2/2004 | Brown |
| 6,735,111 | B2 | 5/2004 | Nejad |
| 6,777,773 | B2 | 8/2004 | Knall |
| 6,834,008 | B2 | 12/2004 | Rinerson et al. |
| 6,847,544 | B1 | 1/2005 | Smith et al. |
| 6,873,543 | B2 | 3/2005 | Smith et al. |
| 6,879,508 | B2 | 4/2005 | Tran |
| 6,881,994 | B2 | 4/2005 | Lee et al. |
| 6,916,740 | B2 | 7/2005 | Kamins |
| 6,946,719 | B2 | 9/2005 | Petti et al. |
| 6,951,780 | B1 | 10/2005 | Herner |
| 6,952,030 | B2 | 10/2005 | Herner et al. |
| 6,952,043 | B2 | 10/2005 | Vyvoda et al. |
| 6,965,137 | B2 | 11/2005 | Kinney et al. |
| 6,999,366 | B2 | 2/2006 | Perner et al. |
| 7,038,248 | B2 | 5/2006 | Lee |
| 7,071,008 | B2 | 7/2006 | Rinerson et al. |
| 7,126,855 | B2 | 10/2006 | Honda et al. |
| 7,176,064 | B2 | 2/2007 | Herner |
| 7,180,815 | B2 | 2/2007 | Fujiu et al. |
| 7,224,013 | B2 | 5/2007 | Herner et al. |
| 7,283,403 | B2 | 10/2007 | Johnson |
| 2004/0016991 | A1 | 1/2004 | Johnson et al. |
| 2004/0159867 | A1 | 8/2004 | Kinney et al. |
| 2004/0160818 | A1 | 8/2004 | Rinerson |
| 2004/0161888 | A1 | 8/2004 | Rinerson |
| 2004/0222467 | A1* | 11/2004 | Yamazaki et al. ............ 257/351 |
| 2004/0228159 | A1 | 11/2004 | Kostylev et al. |
| 2004/0232509 | A1 | 11/2004 | Vyvoda et al. |
| 2005/0052915 | A1 | 3/2005 | Herner et al. |
| 2005/0063220 | A1* | 3/2005 | Johnson ..................... 365/154 |
| 2005/0098800 | A1 | 5/2005 | Herner et al. |
| 2005/0121742 | A1 | 6/2005 | Petti et al. |
| 2005/0121743 | A1* | 6/2005 | Herner ....................... 257/530 |
| 2006/0250836 | A1 | 11/2006 | Herner et al. |
| 2006/0250837 | A1 | 11/2006 | Herner et al. |
| 2007/0069276 | A1 | 3/2007 | Scheuerlein et al. |
| 2007/0072360 | A1 | 3/2007 | Kumar et al. |
| 2007/0164388 | A1 | 7/2007 | Kumar et al. |

FOREIGN PATENT DOCUMENTS

| | | |
|---|---|---|
| TW | 588352 B | 5/2004 |
| TW | I 225716 B | 12/2004 |
| WO | WO 2004/055827 | 7/2004 |

OTHER PUBLICATIONS

U.S. Appl. No. 10/095,962, filed Mar. 13, 2002, Herner et al.
U.S. Appl. No. 10/185,507, filed Jun. 27, 2002, Vyvoda et al.
U.S. Appl. No. 10/440,882, filed May 19, 2003, Vyvoda et al.
U.S. Appl. No. 10/728,436, filed Dec. 5, 2003, Chen.
U.S. Appl. No. 10/728,451, filed Dec. 5, 2003, Cleeves et al.
U.S. Appl. No. 10/883,417, filed Jun. 30, 2004, Raghuram et al.
U.S. Appl. No. 10/954,510, filed Sep. 29, 2004, Herner.
U.S. Appl. No. 11/148,530, filed Jun. 8, 2006, Herner et al.
U.S. Appl. No. 11/395,995, filed Mar. 31, 2006, Herner et al.
U.S. Appl. No. 11/444,936, May 31, 2006, Radigan et al.
Babcock, J. A. et al., "Polysilicon Resistor Trimming for Packaged Integrated Circuits", IEDM 93, 1993, pp. 247-250.
Chiang, Steve et al., "Antifuse Structure Comparison for Field Programmable Gate Arrays", IEDM 92-611, Apr. 1992, pp. 24.6.1-24.6.4.
Feldbaumer, D. W. et al., "Theory and Application of Polysilicon Resistor Trimming", Solid-State Electronics, vol. 38, No. 11, 1995, pp. 1861-1869.
Hamdy, Esmat et al., "Dielectric Based Antifuse for Logic and Memory ICs", IEDM 88, 1998, pp. 786-789.
Hatalis, Miltiadis K., et al., "Large grain polycrystalline silicon by low-temperature annealing of low-pressure chemical vapor deposited amorphous silicon films", J. Appl. Phys., vol. 63, No. 7, Apr. 1988, pp. 2260-2266.
Herner, S. B. et al., "Polycrystalline silicon/CoSi2 Schottky diode with integrated SiO2 antifuse: a nonvolatile memory cell", Applied Physics Letters, vol. 82, No. 23, Jun. 2003, pp. 4163-4165.
Holloway, Karen et al., "Amorphous Ti-Si alloy formed by interdiffusion of amorphous Si and crystalline Ti multilayers", J. Appl. Phys., vol. 61, No. 4, Feb. 1987, pp. 1359-1364.
Kim, Tae-Kyun et al., "Oxidation behavior of a patterned TiSi2/polysilicon stack", J. Vac. Sci. Technol. B., vol. 19, No. 2, Mar./Apr. 2001, pp. 366-371.
Konakova, R. V. et al., "Ohmic Contacts for Microwave Diodes", Proc. 22$^{nd}$ International Conference on Microelectronics (MIEL 2000), vol. 2, NIS Serbia, May 14-17, 2000, Jan. 1999, pp. 477-480.
Mahan, J.E. et al., "Threshold and Memory Switching in Polycrystalline Silicon", Applied Physics Letter, vol. 41, No. 5, Sep. 1982, pp. 479-481.
Malhotra, Vinod et al., "An Electrothermal Model of Memory Switching in Vertical Polycrystalline Silicon Structures", IEEE Transactions of Electron Devices, vol. 35, No. 9, Sep. 1988, pp. 1514-1523.
Shih, Chih-Ching et al., "Characterization and Modeling of a Highly Reliable Metal-to-Metal Antifuse for High-Performance and High-Density Field-Programmable Gate Arrays", 1997 IEEE, Sep. 1997, pp. 25-33.
Tang, Qiang et al., "Twinning in TiSi2-island catalyzed Si nanowires grown by gas-source molecular-beam epitaxy", Applied Physics Letters, vol. 81, No. 13, Sep. 2002, pp. 2451-2453.
Tung, R. T., "Oxide mediated epitaxy of CoSi2 on silicon", Appl. Phys. Lett., vol. 68, No. 24, Jun. 1996, pp. 3461-3463.
Wang, Shoue-Jen et al., "High-Performance Metal/Silicide Antifuse", IEEE Electron Device Letters, vol. 13, No. 9, Sep. 1992, pp. 471-472.
Alavi et al., "A PROM Element Based on Salicide Agglomeration of Poly Fuses in a CMOS Logic Process," IDEM 97, 1997, 855-858.
Anemiya et al., "Electrical Trimming of Heavily Doped Polycrystalline Silicon Resistors," IEEE Transactions Electron Devices, vol. ED-26, No. 11, Nov. 1979, 1738-1742.
Babcock et al., "Precision Electrical Trimming of Very Low TCR Poly-Sige Resistors," IEEE Service Center, New York, NY, vol. 21, No. 6, Jun. 2000, pp. 283-285, XP000951962 ISSN: 0741-3106, abstract Figs. 2,4.
Das et al., "A Large-Bias Conduction Model of Polycrystalline Silicon Films," IEEE Transactions on Electron Devices, vol. 41, No. 4, Apr. 1994, 524-532.
Das et al., "Electrical Trimmjing of Ion-Beam-Sputtered Polysilicon Resistors by High Current Pulses," IEEE Transaction on Electron Devices, vol. 41, No. 8, Aug. 1994, 1429-1434.
Feldbaumer et al., "Theory and Application of Polysilicon Resistor Trimming," Solid-State Electronics, vol. 38, No. 11, Jan. 1995, 1861-1869.
Feldbaumer, D.W., "Pulse Current Trimming of Polysilicon Resistors," IEEE Transactions on Electron Devices, vol. 42, No. 4, Apr. 1995, 689-696.
Kato et al., "A Monolithic 14 Bit D/A Converter Fabricated with a New Trimming Technique (DOT)," IEEE Journal of Solid-State Circuits, vol. SC-19, No. 5, Oct. 1984, 802-804-806.

Kato et al., "A Physical Mechanism of Current-Induced Resistance Decrease in Heavily Doped Polysilicon Resistors," IEEE Transaction on Electron Devices, vol. ED-29, No. 8, Aug. 1982, 1156-1160.

Kato et al., "Change in Temperature Coefficient of Resistance of Heavily Doped Polysilicon Resistors Caused by Electrical Trimming," Jpn. J. Appl. Phys., vol. 35, part 1, No. 8, Aug. 1996, 4209-4215.

Kato et al., "Constant Voltage Trimming of Heavily Doped Polysilicon Resistors," Jpn. J. Appl. Phys., vol. 34, part 1, No. 1, Jan. 1995, 48-53.

Lane, William A., "The Design of Thin-Film Polysilicon Resistors for Analog IC Applications," IEEE Transactions on Electron Devices, vol. 36, No. 4, Apr. 1989, 738-744.

Tobita, Toshio, "New Trimming Technology of a Thick Film Resistor by the Pulse Voltage Method," IEEE Transactions on Components, Hybrids and Manufacturing Technology, vol. 14, No. 3, Sep. 1991, 613-617.

Office Action dated Mar. 19, 2009 received in related U.S. Appl. No. 11/496,986.

Taiwan Search Report dated Jan. 4, 2009 received in corresponding Taiwan Application No. 095135852.

International Search Report dated Oct. 8, 2008 received in corresponding International Application No. PCT/US2008/007800 (3 pgs.).

Office Action dated Oct. 30, 2008 received in corresponding U.S. Appl. No. 11/496,986.

* cited by examiner

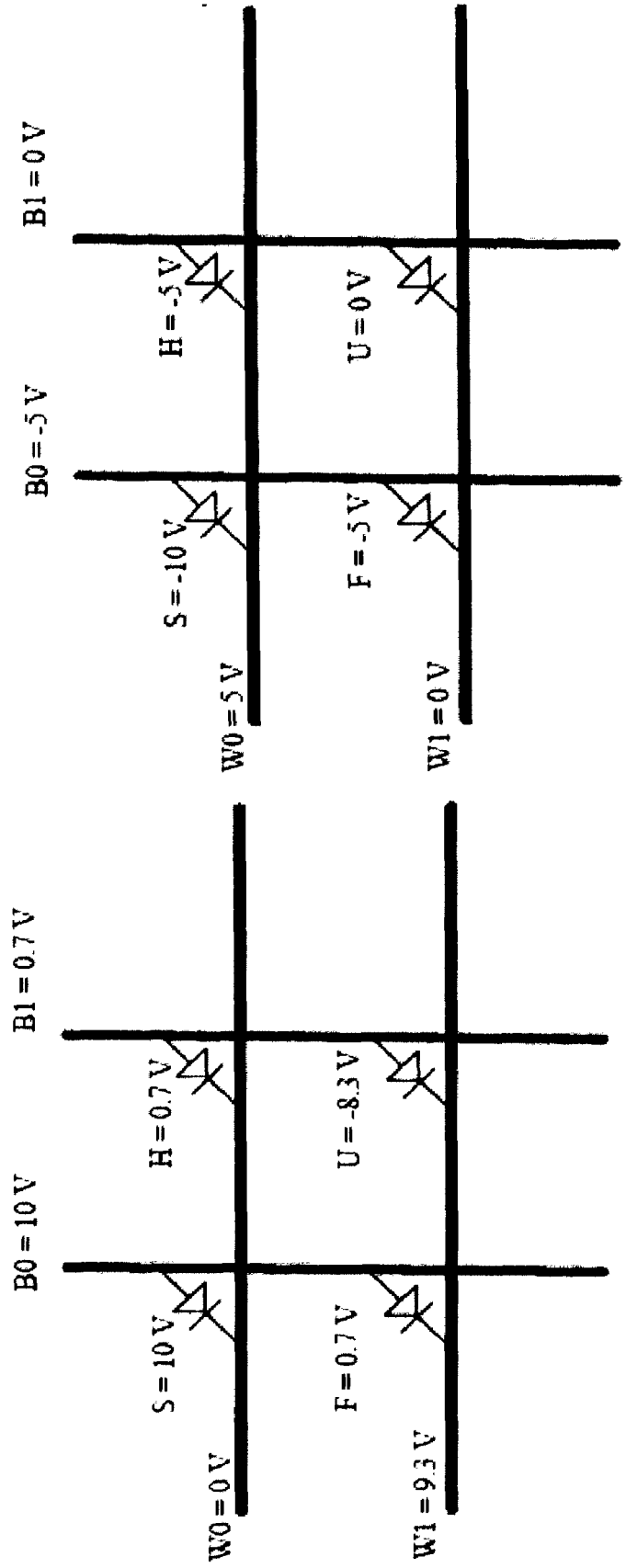

METHOD OF MAKING A DIODE READ/WRITE MEMORY CELL IN A PROGRAMMED STATE

This application is a continuation-in-part of U.S. application Ser. No. 11/496,986 filed on Jul. 31, 2006, which is a continuation-in part of U.S. application Ser. No. 11/237,167, filed on Sep. 28, 2005. This application is also a continuation-in-part of U.S. application Ser. No. 11/613,151 filed on Dec. 19, 2006, which is a divisional of U.S. application Ser. No. 10/954,510 filed on Sep. 29, 2004, now U.S. Pat. No. 7,176,064, which is a continuation-in-part of U.S. application Ser. No. 10/728,230, filed on Dec. 3, 2003, now U.S. Pat. No. 6,946,719. This application is also a continuation-in-part of U.S. application Ser. No. 10/955,549 filed on Sep. 29, 2004 which is a continuation-in-part of U.S. application Ser. No. 10/855,784 filed on May 26, 2004, which is a continuation-in-part of U.S. application Ser. No. 10/326,470 filed on Dec. 19, 2002, now abandoned. All of the above applications are hereby incorporated by reference in their entirety. This application is related to Kumar et al., U.S. application Ser. No. 11/693,858, titled "MEMORY CELL COMPRISING A DIODE FABRICATED IN A LOW RESISTIVITY, PROGRAMMED STATE", filed on the same day herewith, and hereby incorporated by reference in its entirety.

BACKGROUND OF THE INVENTION

The invention relates to a nonvolatile memory array.

Nonvolatile memory arrays maintain their data even when power to the device is turned off. In one-time-programmable arrays, each memory cell is formed in an initial unprogrammed state, and can be converted to a programmed state. This change is permanent, and such cells are not erasable. In other types of memories, the memory cells are erasable, and can be rewritten many times.

Cells may also vary in the number of data states each cell can achieve. A data state may be stored by altering some characteristic of the cell which can be detected, such as current flowing through the cell under a given applied voltage or the threshold voltage of a transistor within the cell. A data state is a distinct value of the cell, such as a data '0' or a data '1'.

Some solutions for achieving erasable or multi-state cells are complex. Floating gate and SONOS memory cells, for example, operate by storing charge, where the presence, absence or amount of stored charge changes a transistor threshold voltage. These memory cells are three-terminal devices which are relatively difficult to fabricate and operate at the very small dimensions required for competitiveness in modern integrated circuits.

Other memory cells operate by changing the resistivity of relatively exotic materials, like chalcogenides. Chalcogenides are difficult to work with and can present challenges in most semiconductor production facilities.

A substantial advantage would be provided by a nonvolatile memory array having erasable or multi-state memory cells formed using conventional semiconductor materials in structures that are readily scaled to small size.

SUMMARY OF THE PREFERRED EMBODIMENTS

One embodiment of the invention provides a method of making a nonvolatile memory device comprising at least one memory cell which consists essentially of a diode and electrically conductive electrodes contacting the diode, the method comprising fabricating the diode in a low resistivity, programmed state without an electrical programming step.

Another embodiment of the invention provides a method of making a diode, comprising forming a first electrode, forming a semiconductor region in electrical contact with the first electrode, wherein the semiconductor region comprises a p-n or a p-i-n junction in at least one silicon, germanium or silicon-germanium layer, forming a titanium layer on the semiconductor region, forming a titanium nitride layer on the titanium layer, reacting the titanium layer with the semiconductor region to form a titanium silicide, titanium germanide, or titanium silicide-germanide layer on the semiconductor region, removing the titanium nitride layer and a remaining portion of the titanium layer after the step of reacting, and forming a second electrode in electrical contact with the titanium silicide, titanium germanide or titanium silicide-germanide layer.

Another embodiment of the invention provides a method of operating a diode memory cell, comprising providing the diode which is fabricated in a low resistivity, programmed state without an electrical programming step, applying a reverse bias greater than a predetermined critical voltage value to the diode to switch the diode to a high resistivity, unprogrammed state, and applying a forward bias to the diode to switch the diode to the low resistivity, programmed state.

Each of the aspects and embodiments of the invention described herein can be used alone or in combination with one another. The preferred aspects and embodiments will now be described with reference to the attached drawings.

BRIEF DESCRIPTION OF THE DRAWINGS

FIG. 6 is a circuit diagram showing a biasing scheme to bias the S cell in forward bias.

FIG. 7 is a circuit diagram showing one biasing scheme to bias the S cell in reverse bias.

DETAILED DESCRIPTION OF THE PREFERRED EMBODIMENTS

It has been known that by applying electrical pulses, the resistance of a resistor formed of doped polycrystalline silicon, or polysilicon, can be trimmed, adjusting it between stable resistance states. Such trimmable resistors have been used as elements in integrated circuits.

Figure 1:
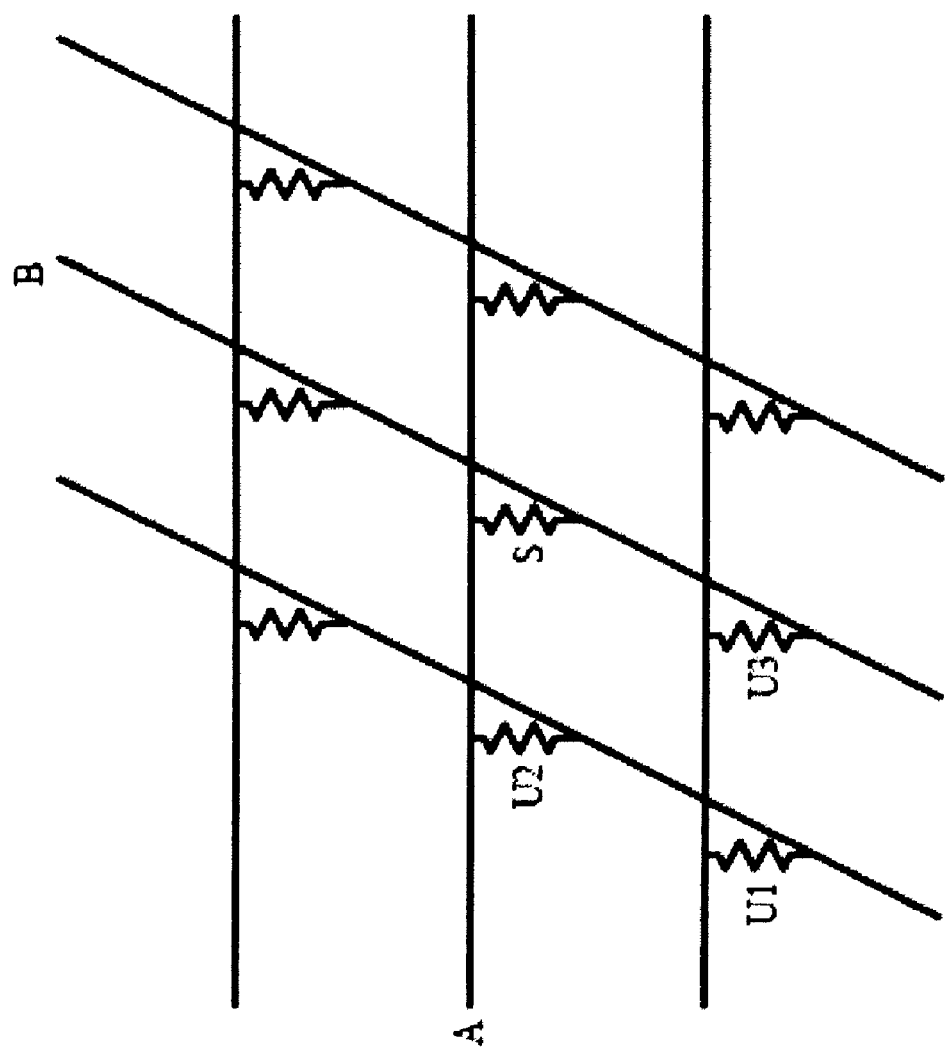
FIG. 1 is a circuit diagram illustrating the need for electrical isolation between memory cells in a memory array.

It is not conventional to use a trimmable polysilicon resistor to store a data state in a nonvolatile memory cell, however. Making a memory array of polysilicon resistors presents difficulties. If resistors are used as memory cells in a large cross-point array, when voltage is applied to a selected cell, there will be undesired leakage through half-selected and unselected cells throughout the array. For example, turning to FIG. 1, suppose a voltage is applied between bitline B and wordline A to set, reset, or sense selected cell S. Current is intended to flow through selected cell S. Some leakage current, however, may flow on alternate paths, for example between bitline B and wordline A through unselected cells U1, U2, and U3. Many such alternate paths may exist.

Leakage current can be greatly reduced by forming each memory cell as a two-terminal device including a diode. A diode has a non-linear I-V characteristic, allowing very little current flow below a turn-on voltage, and substantially higher current flow above the turn-on voltage. In general a diode also acts as one-way valves passing current more easily in one direction than the other. Thus, so long as biasing schemes are selected that assure that only the selected cell is subjected to a forward current above the turn-on voltage, leakage current along unintended paths (such as the U1-U2-U3 sneak path of FIG. 1) can be greatly reduced.

In embodiments of the present invention, by applying appropriate electrical pulses, a memory element formed of doped semiconductor material, for example the semiconductor diode of U.S. patent application Ser. No. 10/955,549, "Nonvolatile Memory Cell Without a Dielectric Antifuse Having High- and Low-Impedance States," filed Sep. 29, 2004, hereinafter the '549 application and hereby incorporated by reference, can achieve three, four, or more stable resistivity states. In other embodiments of the present invention, semiconductor material can be converted from an initial low-resistivity state to a higher-resistivity state; then, upon application of an appropriate electrical pulse, can be returned to a lower-resistivity state. These embodiments can be employed independently or combined to form a memory cell which can have two or more data states, and can be one-time-programmable or rewriteable.

Herner et al., U.S. patent application Ser. No. 11/148,530, "Nonvolatile Memory Cell Operating by Increasing Order in Polycrystalline Semiconductor Material," filed Jun. 8, 2006; and Herner, U.S. patent application Ser. No. 10/954,510, "Memory Cell Comprising a Semiconductor Junction Diode Crystallized Adjacent to a Silicide," filed Sep. 29, 2004, both owned by the assignee of the present invention and both hereby incorporated by reference, describe that crystallization of polysilicon adjacent to an appropriate silicide affects the properties of the polysilicon. Certain metal silicides, such as cobalt silicide and titanium silicide, have a lattice structure very close to that of silicon. When amorphous or microcrystalline silicon is crystallized in contact with one of these silicides, the crystal lattice of the silicide provides a template to the silicon during crystallization. The resulting polysilicon will be highly ordered, and relatively low in defects. This high-quality polysilicon, when doped with a conductivity-enhancing dopant, is relatively highly conductive as formed.

As noted, including a diode between conductors in the memory cell allows its formation in a highly dense cross-point memory array. In preferred embodiments of the present invention, then, a polycrystalline, amorphous, or microcrystalline semiconductor memory element is formed of the diode itself.

In this discussion, transition from a higher resistivity, unprogrammed state to a lower resistivity, programmed state will be called a set transition, affected by a set current, a set voltage, or a set pulse; while the reverse transition, from a lower resistivity, programmed state to a higher resistivity, unprogrammed state, will be called a reset transition, affected by a reset current, a reset voltage, or a reset pulse. The higher resistivity, unprogrammed state corresponds to a "1" memory state, while the lower resistivity, programmed state corresponds to a "0" memory state.

Figure 2:
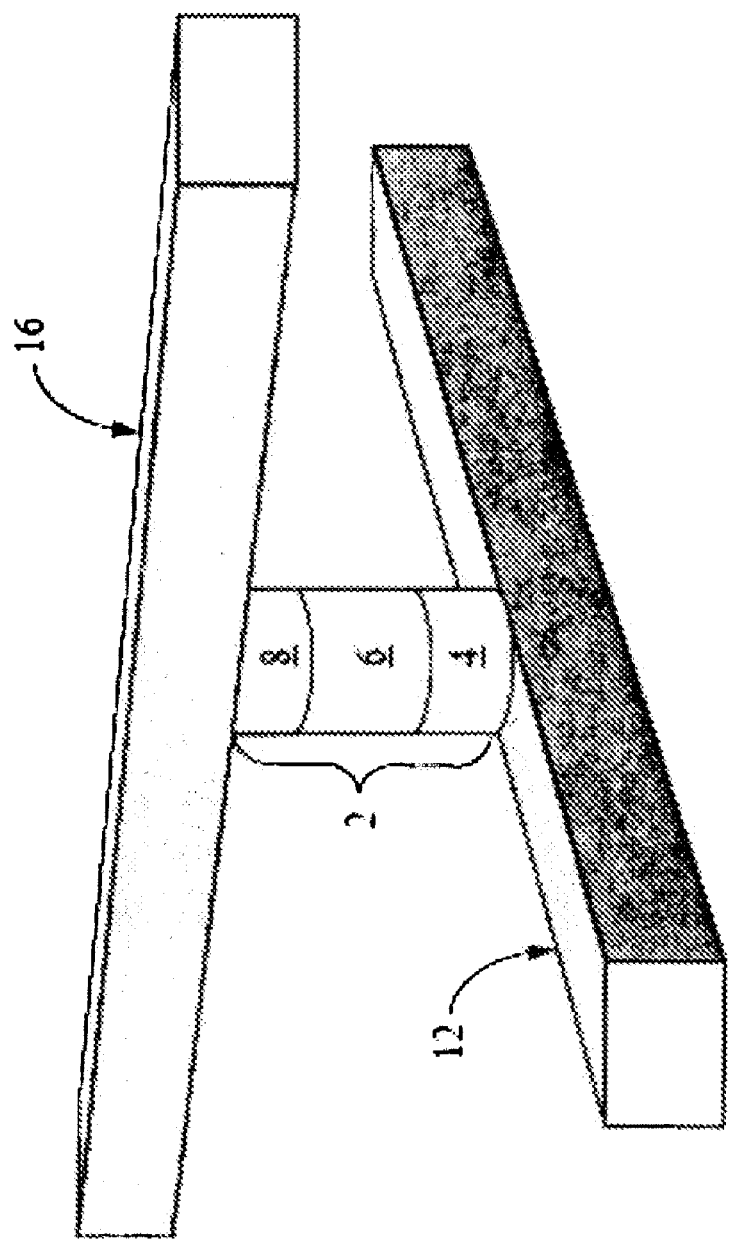
FIGS. 2 and 11 are perspective views of memory cells formed according to a preferred embodiment of the present invention.
Figure 3:
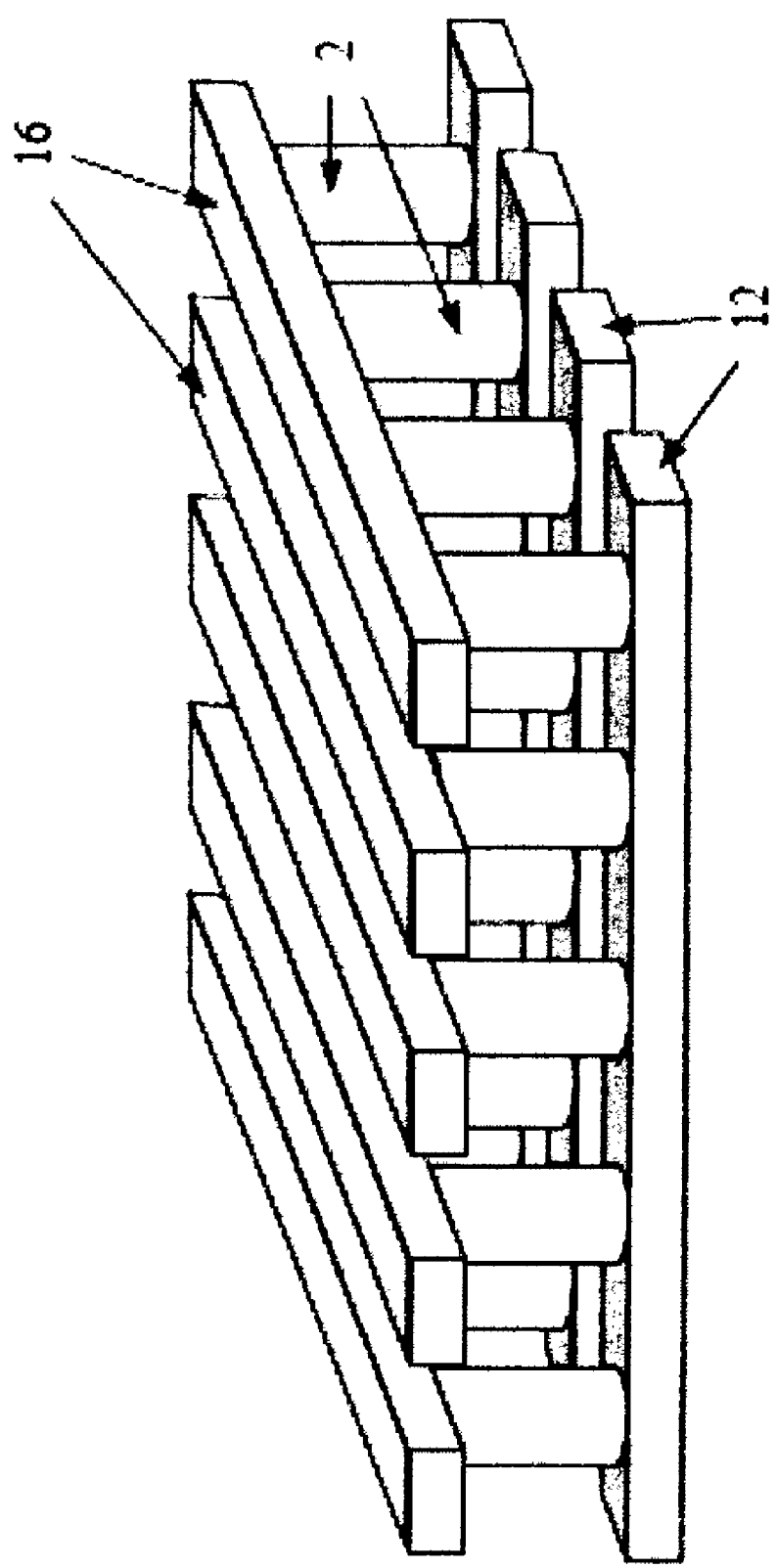
FIG. 3 is a perspective view of a portion of a memory level comprising the memory cells of FIG. 2.

FIG. 2 illustrates a memory cell formed according to a preferred embodiment of the present invention. A bottom conductor 12 is formed of a conductive material, for example tungsten, and extends in a first direction. Barrier and adhesion layers may be included in bottom conductor 12. Polycrystalline semiconductor diode 2 has a bottom heavily doped n-type region 4; an intrinsic region 6, which is not intentionally doped; and a top heavily doped p-type region 8, though the orientation of this diode may be reversed. Such a diode, regardless of its orientation, will be referred to as a p-i-n diode. Top conductor 16 may be formed in the same manner and of the same materials as bottom conductor 12, and extends in a second direction different from the first direction. Polycrystalline semiconductor diode 2 is vertically disposed between bottom conductor 12 and top conductor 16. Polycrystalline semiconductor diode 2 is formed in a low-resistivity state. This memory cell can be formed above a suitable substrate, for example above a monocrystalline silicon wafer. FIG. 3 shows a portion of a memory level of such devices formed in a cross-point array, where diodes 2 are disposed between bottom conductors 12 and top conductors 16. Multiple memory levels can be stacked over a substrate to form a highly dense monolithic three dimensional memory array.

Preferably, the nonvolatile memory cell which consists essentially of the diode 2 and the electrically conductive electrodes 12 and 16 contacting the diode. The memory cell does not include any active or passive device, such as a transistor, a capacitor, a resistor, a fuse, an antifuse, a charge storage material, a phase change material or a resistivity change material, except the diode 2. The memory cell may also contain an insulating material which surrounds the diode, as will be described below, and other optional layers. The memory cell comprises a read/write memory cell, such as a rewritable memory cell. The diode 2 acts as the read/write element of the memory cell, by switching from a first resistivity state to a second resistivity state different from the first resistivity state in response to an applied bias (i.e., pulse) as will be explained in more detail below.

Figure 11:
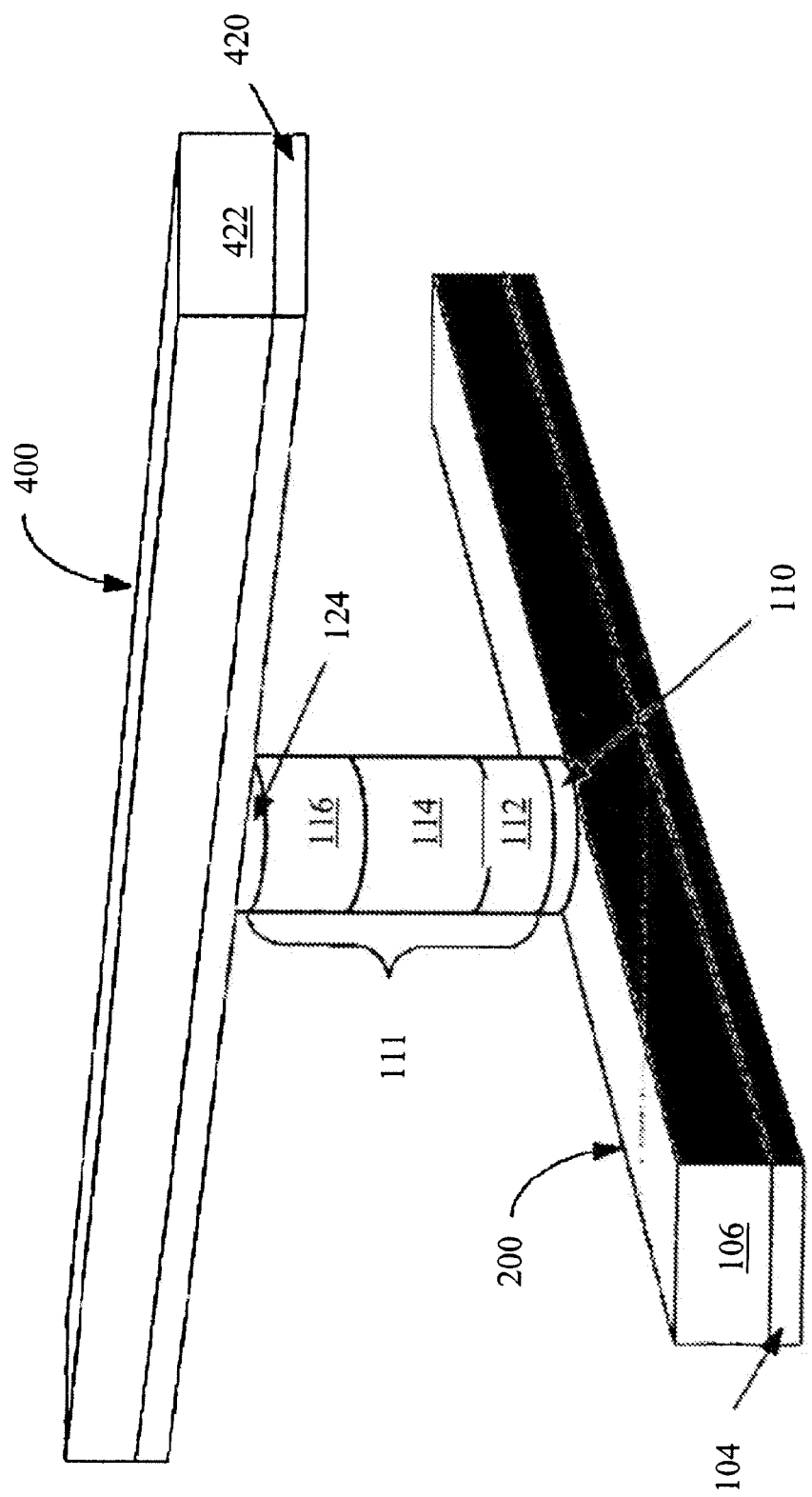

As shown in FIG. 2, the diode comprises a polycrystalline semiconductor diode, such as a polycrystalline silicon, germanium or silicon-germanium p-i-n pillar diode having a substantially cylindrical shape. As will be explained in more detail with respect to FIG. 11, at least one electrode of the memory cell includes a metal silicide layer 124, such as titanium silicide, titanium germanide or titanium silicide-germanide layer, having the C49 phase, in physical contact with the diode 2. As shown in FIG. 11, the silicide layer 124 preferably does not extend the entire length of the adjacent electrode 16, 400, but is physically located only on the substantially cylindrical pillar shaped diode 2, 111. The silicide layer acts as a crystallization template for the semiconductor diode 2 such that the diode is fabricated in the low resistivity, programmed state without an electrical programming step. Without wishing to be bound by a particular theory, the low resistivity of the diode is believed to be a result of a large grain size of the polycrystalline semiconductor material that is crystallized in contact with the crystallization template.

In this discussion, a region of semiconductor material which is not intentionally doped is described as an intrinsic region. It will be understood by those skilled in the art, however, that an intrinsic region may in fact include a low concentration of p-type or n-type dopants. Dopants may diffuse into the intrinsic region from adjacent regions, or may be present in the deposition chamber during deposition due to contamination from an earlier deposition. It will further be understood that deposited intrinsic semiconductor material (such as silicon) may include defects which cause it to behave as if slightly n-doped. Use of the term "intrinsic" to describe silicon, germanium, a silicon-germanium alloy, or some other semiconductor material is not meant to imply that this region contains no dopants whatsoever, nor that such a region is perfectly electrically neutral.

The resistivity of doped polycrystalline or microcrystalline semiconductor material, for example silicon, can be changed between stable states by applying appropriate electrical pulses. It has been found that in preferred embodiments, set transitions are advantageously performed with the diode under forward bias, while reset transitions are most readily achieved and controlled with the diode under reverse bias. In some instances, however, set transitions may be achieved with the diode under reverse bias, while reset transitions are achieved with the diode under forward bias.

Semiconductor switching behavior is complex. For a diode, both set and reset transitions have been achieved with the diode under forward bias. Generally a reset pulse applied with the diode under forward bias which is sufficient to switch the polycrystalline semiconductor material making up a diode from a given resistivity state to a higher resistivity state will be lower voltage amplitude than a corresponding set pulse (which will switch the same polysilicon semiconductor material from the same resistivity state to a lower resistivity state) and will have a longer pulse width.

Figure 4:
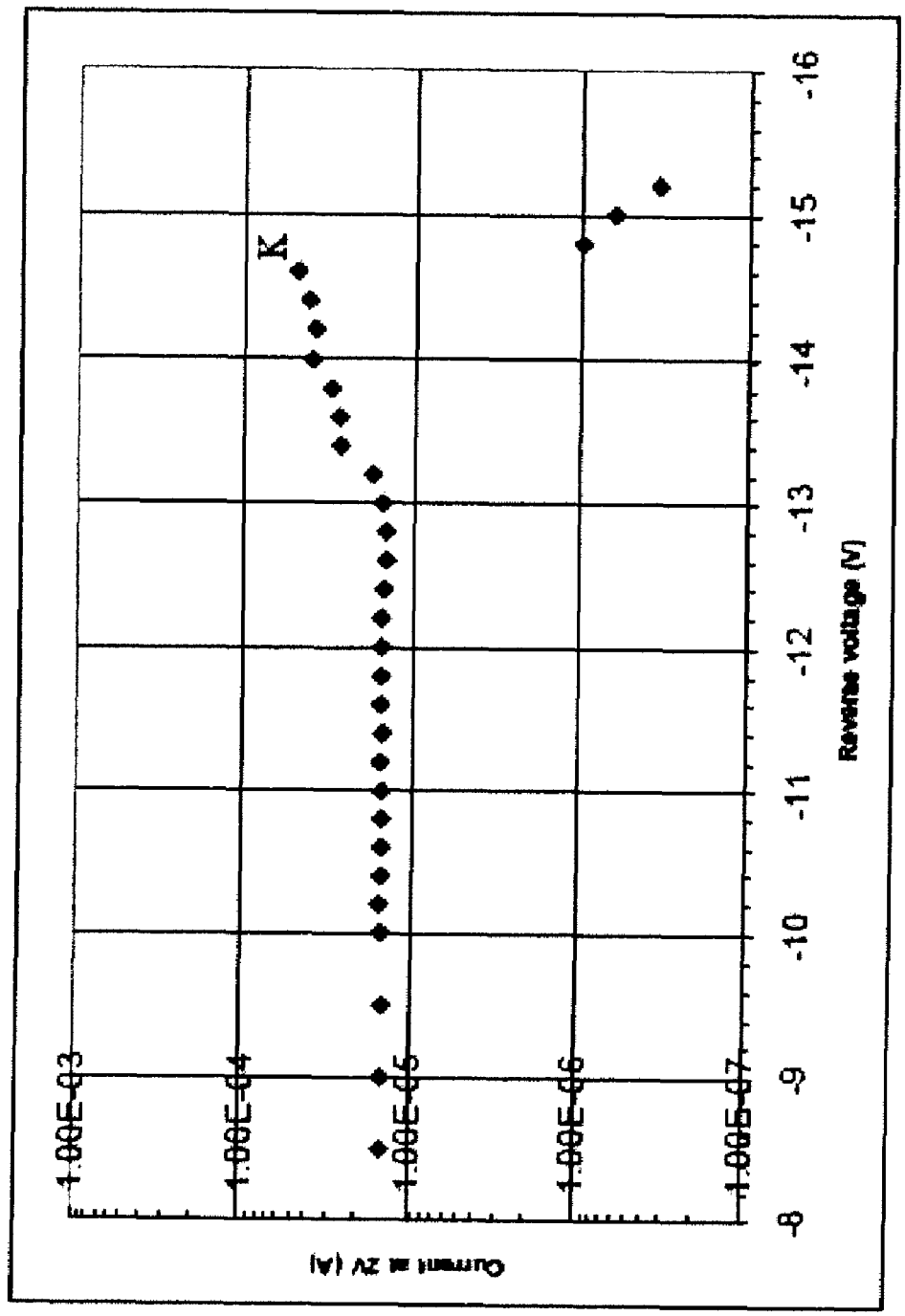
FIG. 4 is a graph showing change in read current for a memory cell of an embodiment of the present invention as voltage in reverse bias across the diode increases.

Switching under reverse bias shows a distinct behavior. Suppose a polysilicon p-i-n diode such as the one shown in FIG. 2 is subjected to a relatively large switching pulse under reverse bias. After application of the switching pulse, a smaller read pulse, for example 2 volts, is applied, and the current flowing through the diode at the read voltage, called the read current, is measured. As the voltage of the switching pulse under reverse bias is increased in subsequent pulses, the subsequent read current at two volts changes as shown in FIG. 4. It will be seen that initially as the reverse voltage and current of the switching pulse are increased, the read current, when a read voltage is applied after each switching pulse, increases; i.e. the initial transition of the semiconductor material (silicon, in this case) is in the set direction toward lower resistivity. Once the switching pulse reaches a certain critical reverse bias voltage, at point K in FIG. 4, about −14.6 volts in this example, the read current abruptly begins to drop as reset is achieved and resistivity of the silicon increases. The switching voltage at which the set trend is reversed and the silicon of the diode begins to reset varies, depending on, for example, the resistivity state of the silicon making up the diode when application of the reverse bias switching pulse is begun. It will be seen, then, that by selecting appropriate voltages, either set or reset of the semiconductor material making up the diode can be achieved with the diode under reverse bias.

Distinct data states of the memory cell of the embodiments of the present invention correspond to resistivity states of polycrystalline or microcrystalline semiconductor material making up the diode, which are distinguished by detecting current flow through the memory cell (between top conductor 16 and bottom conductor 12) when a read voltage is applied. Preferably the current flowing between any one distinct data state and any different distinct data state is at least a factor of two, to allow the difference between the states to be readily detectable.

The memory cell can be used as a one-time programmable cell or a rewriteable memory cell, and may have two, three, four, or more distinct data states. The cell can be converted from any of its data states to any other of its data states in any order, and under either forward or reverse bias.

Several examples of preferred embodiments will be provided. It will be understood, however, that these examples are not intended to be limiting. It will be apparent to those skilled in the art that other methods of programming a two-terminal device comprising a diode and polycrystalline or microcrystalline semiconductor material will fall within the scope of the invention.

Rewritable Memory Cell

In one set of embodiments, the memory cell behaves as a rewriteable memory cell, which is repeatably switchable between two or between three data states.

Figure 5:
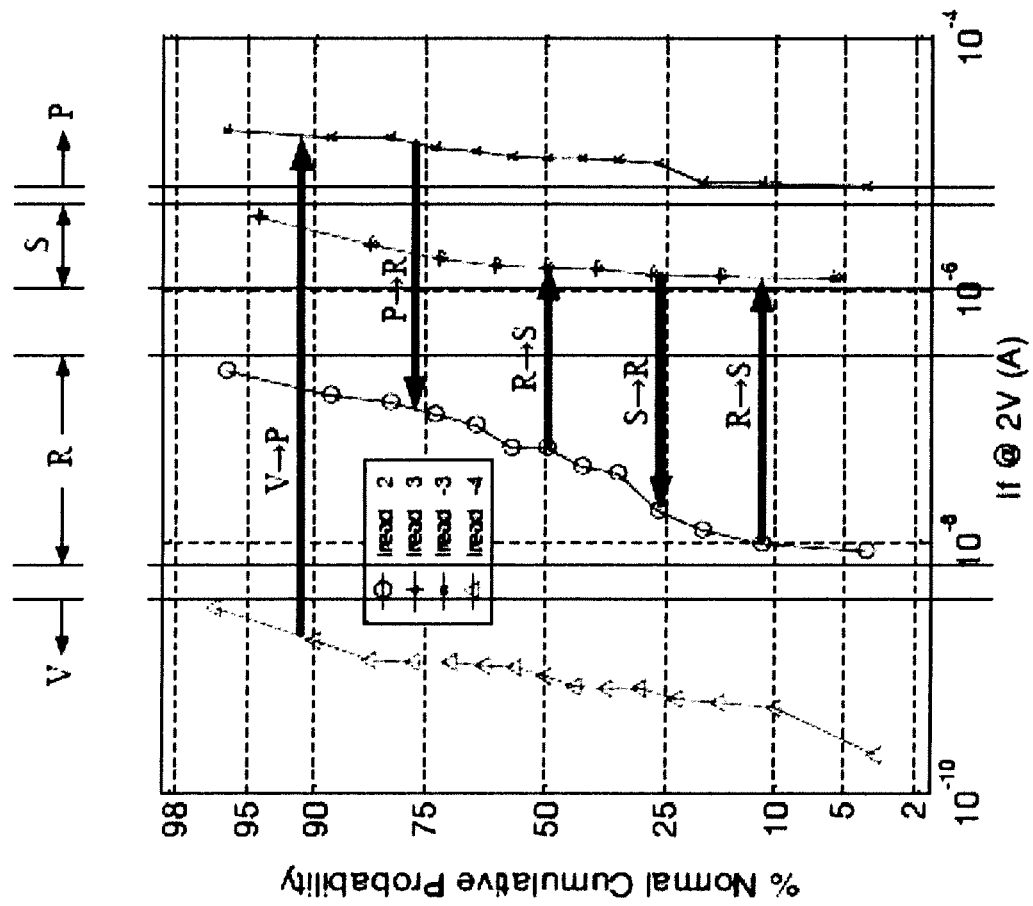
FIG. 5 is a probability plot showing memory cells transformed from the P state to the R state, and from the R state to the S state, then repeatably between the S state and the R state.

Turning to FIG. 5, in a first preferred embodiment, the memory cell is formed in a low resistivity, programmed state P. Thus, the formation of the memory cell in the high resistivity, unprogrammed state V and the application of the forward bias electrical pulse which switches the semiconductor material of diode 2 from the high resistivity state V to the low resistivity state P is avoided. This simplifies the programming and handling of the memory cell because the device fabrication factory does not have to program the memory cells to the low resistivity, programmed P state before providing the memory device to the end users, since for most rewriteable embodiments, the initial V state does not serve as a data state of the memory cell.

A first electrical pulse, preferably with diode 2 under reverse bias, is applied between top conductor 16 and bottom conductor 12. The pulse magnitude is above a predetermined critical voltage required to switch the resistivity state of the diode 2. For example, the voltage is between about −8 and about −14 volts, preferably between about −9 and about −13 volts, more preferably about −10 or −11 or −13 or −13.5 volts. The voltage required will vary with the thickness of the intrinsic region. This electrical pulse switches the semiconductor material of diode 2 from the low resistivity P state to a high resistivity R state.

A second electrical pulse can be applied between top conductor 16 and bottom conductor 12, preferably under forward bias. The pulse magnitude is above a predetermined critical voltage required to switch the resistivity state of the diode 2. This pulse is, for example, between about 5.5 and about 9 volts, such as between about 6 to about 8 volts, preferably about 6.5 volts, with current between about 10 and about 200 microamps, preferably between about 50 and about 100 microamps. This electrical pulse switches the semiconductor material of diode 2 from the high resistivity, unprogrammed R state to a low resistivity, programmed S state. In preferred embodiments, the R and/or S states correspond to a data state of the memory cell.

In this rewriteable, two-state embodiment, the R state and the S state are sensed, or read, as data states. The memory cell can repeatedly be switched between these two states. For example, a third electrical pulse, preferably with diode 2 under reverse bias, switches the semiconductor material of the diode from the low resistivity state S to the high resistivity state R. A fourth electrical pulse, preferably with diode 2 under forward bias, switches the semiconductor material of the diode from the high resistivity state R to the low resistivity state S, and so on.

As will be seen from FIG. 5, in the example provided, the difference between current flow under read voltage, for example of 2 volts, between top conductor 16 and bottom conductor 12 between any cell in one data state and any cell in an adjacent data states, in this case the R data state (between about 10 and about 500 nanoamps) and the S data state (between about 1.5 and about 4.5 microamps), is at least a factor of three. Depending on the ranges selected for each data state, the difference may be a factor of two, three, five, or more.

In alternative embodiments, a rewriteable memory cell can be switched between three or more data states, in any order. Either set or reset transitions can be performed with the diode under either forward or reverse bias.

In the embodiments described, note that the data state corresponds to the resistivity state of polycrystalline or microcrystalline semiconductor material making up a diode. The data states does not correspond to the resistivity state of a resistivity-switching metal oxide or nitride, as in Herner et al., U.S. patent application Ser. No. 11/395,995, "Nonvolatile Memory Cell Comprising a Diode and a Resistance-Switching Material," filed Mar. 31, 2006, owned by the assignee of the present invention and hereby incorporated by reference.

Reverse Bias Set and Reset

In an array of memory cells formed and programmed according to the embodiments described so far, any step in which cells are subjected to large voltages in reverse bias has reduced leakage current as compared to a forward bias step.

Turning to FIG. 6, suppose 10 volts is to be applied in forward bias across the selected cell S. (The actual voltage to be used will depend on many factors, including the construction of the cell, dopant levels, height of the intrinsic region, etc.; 10 volts is merely an example.) Bitline B0 is set at 10 volts and wordline W0 is set at ground. To assure that half-selected cells F (which share bitline B0 with selected cell S) remain below the turn-on voltage of the diode, wordline W1 is set less than but relatively close to the voltage of bitline B0; for example wordline W1 may be set to 9.3 volts, so that 0.7 volts is applied across the F cells (only one F cell is shown, but there may be hundreds, thousands or more.) Similarly, to assure that half-selected cells H (which share wordline W0 with selected cell S) remain below the turn-on voltage of the diode, bitline B1 is set higher than but relatively close to the voltage of wordline W0; for example bitline B1 may be set to 0.7 volts, so that 0.7 volts is applied across cell H (again, there may be thousands of H cells.) The unselected cells U, which share neither wordline W0 or bitline B0 with selected cell S, are subjected to −8.6 volts. As there may be millions of unselected cells U, this results in significant leakage current within the array.

FIG. 7 shows an advantageous biasing scheme to apply a large reverse bias across a memory cell, for example as a reset pulse. Bitline B0 is set at −5 volts and wordline W0 at 5 volts, so that −10 volts is applied across selected cell S; the diode is in reverse bias. Setting wordline W1 and bitline B1 at ground subjects both half-selected cells F and H to −5 volts, at a reverse bias low enough not to cause unintentional set or reset of these cells. Set or reset in reverse bias generally seems to take place at or near the voltage at which the diode goes into reverse breakdown, which is generally higher than −5 volts.

With this scheme, there is no voltage across the unselected cells U, resulting in no reverse leakage. As a result, bandwidth can be increased significantly.

The biasing scheme of FIG. 7 is just one example; clearly many other schemes can be used. For example bitline B0 can be set at 0 volts, wordline W0 at −10 volts, and bitline B1 and wordline W1 at −5 volts. The voltage across selected cell S, half-selected cells H and F, and unselected cells U will be the same as in the scheme of FIG. 7. In another example, bitline B0 is set at ground, wordline W0 at 10 volts, and bitline B1 and wordline W1 each at 5 volts.

Iterative Set and Reset

So far this discussion has described applying an appropriate electrical pulse to switch the semiconductor material of a diode from one resistivity state to a different resistivity state, thus switching the memory cell between two distinct data states. In practice, these set and reset steps may be iterative processes.

As described, the difference between current flow during read in adjacent data states is preferably at least a factor of two; in many embodiments, it may be preferred to establish current ranges for each data state which are separated by a factor of three, five, ten, or more.

Figure 8:
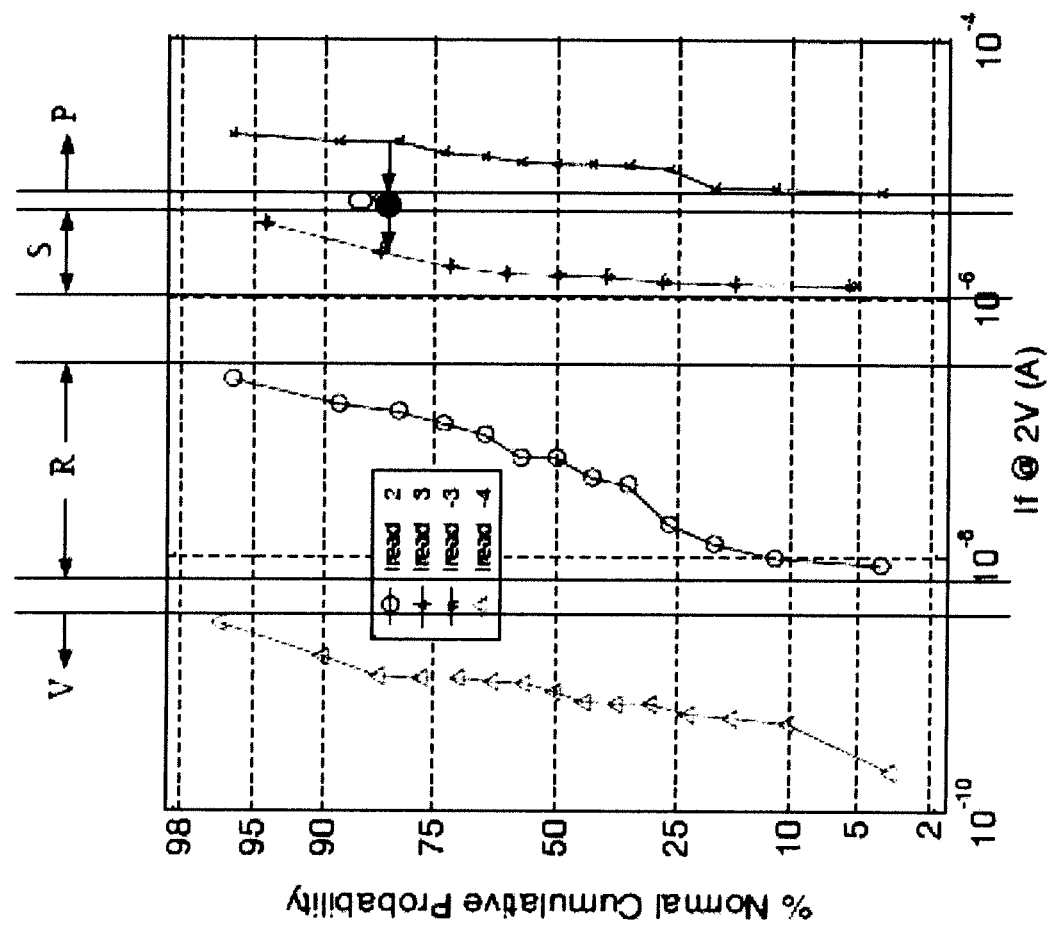
FIG. 8 illustrates iterative read-verify-write cycles to move a cell into a data state.

Turning to FIG. 8, as described, data state V may be omitted by fabricating the diode in the low resistivity, programmed state. The data state R can be defined as read current between about 10 and about 500 nanoamps, data state S as read current between about 1.5 and about 4.5 microamps, and data state P as read current above about 10 microamps. Those skilled in the art will appreciate that these are examples only. Actual read currents will vary with characteristics of the cell, construction of the array, read voltage selected, and many other factors.

Suppose a one-time programmable memory cell is in data state P. An electrical pulse in reverse bias is applied to the memory cell to switch the cell into data state S. In some instances, however, it may be that after application of the electrical pulse, the read current is not in the desired range; i.e. the resistivity state of the semiconductor material of the diode is higher or lower than intended. For example, suppose after application of the electrical pulse, the read current of the memory cell is at the point on the graph shown at Q, in between the S state and P state current ranges.

After an electrical pulse is applied to switch the memory cell to a desired data state, the memory cell may be read to determine if the desired data state was reached. If the desired data state was not reached, an additional pulse is applied. For example, when the current Q is sensed, an additional reset pulse is applied to increase the resistivity of the semiconductor material, decreasing the read current into the range corresponding to the S data state. As described earlier, this set pulse may be applied in either forward or reverse bias. The additional pulse or pulses may have a higher amplitude (voltage or current) or longer or shorter pulse width than the original pulse. After the additional set pulse, the cell is read again, then set or reset pulses applied as appropriate until the read current is in the desired range.

In a two-terminal device, such as the memory cell including a diode described, it will be particularly advantageous to read in order to verify the set or reset and to adjust if necessary. Applying a large reverse bias across the diode may damage the diode; thus when performing a set or reset with the diode under reverse bias, it is advantageous to minimize the reverse bias voltage.

Exemplary Method of Fabricating the Memory Cell

Fabrication of a single memory level will be described in detail. Additional memory levels can be stacked, each monolithically formed above the one below it. In this embodiment, a polycrystalline semiconductor diode will serve as the switchable memory element.

Figure 9A:
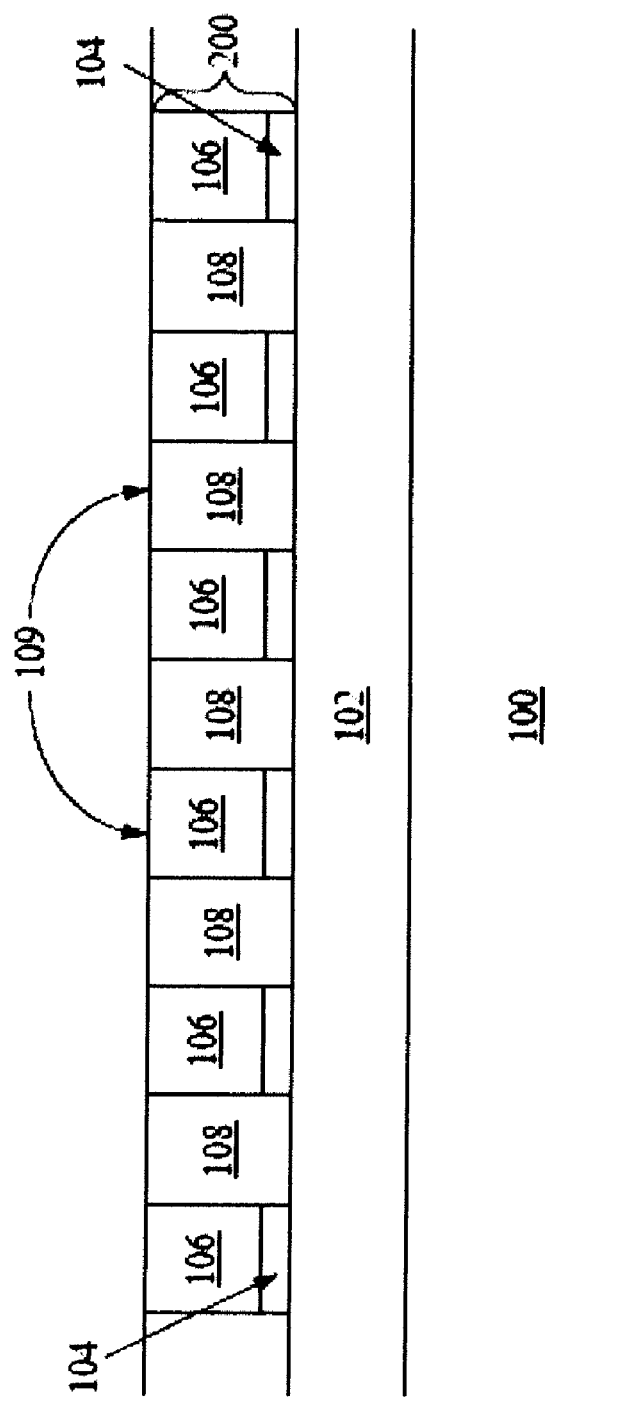
FIGS. 9a-9d are side cross-sectional views illustrating stages in formation of a memory level formed according to an embodiment of the present invention.

Turning to FIG. 9a, formation of the memory begins with a substrate 100. This substrate 100 can be any semiconducting substrate as known in the art, such as monocrystalline silicon, IV-IV compounds such as silicon-germanium or silicon-germanium-carbon, III-v compounds, II-VII compounds, epitaxial layers over such substrates, or any other semiconducting or non-semiconducting material. The substrate may include integrated circuits fabricated therein.

An insulating layer 102 is formed over substrate 100. The insulating layer 102 can be silicon oxide, silicon nitride, high-dielectric film, Si—C—O—H film, or any other suitable insulating material.

The first conductors 200 (i.e., the lower electrode 12 shown in FIG. 2) are formed over the substrate and insulator. An adhesion layer 104 may be included between the insulating layer 102 and the conducting layer 106 to help conducting layer 106 adhere to insulating layer 102. If the overlying conducting layer is tungsten, titanium nitride is preferred as adhesion layer 104.

The next layer to be deposited is conducting layer 106. Conducting layer 106 can comprise any conducting material known in the art, such as tungsten, or other materials, including tantalum, titanium, copper, cobalt, or alloys thereof.

Once all the layers that will form the conductor rails have been deposited, the layers will be patterned and etched using any suitable masking and etching process to form substantially parallel, substantially coplanar conductors 200, shown in FIG. 9a in cross-section. In one embodiment, photoresist is deposited, patterned by photolithography and the layers etched, and then the photoresist removed using standard process techniques. Conductors 200 could be formed by a Damascene method instead.

Next a dielectric material 108 is deposited over and between conductor rails 200. Dielectric material 108 can be any known electrically insulating material, such as silicon oxide, silicon nitride, or silicon oxynitride. In a preferred embodiment, silicon dioxide is used as dielectric material 108.

Finally, excess dielectric material 108 on top of conductor rails 200 is removed, exposing the tops of conductor rails 200 separated by dielectric material 108, and leaving a substantially planar surface 109. The resulting structure is shown in FIG. 9a. This removal of dielectric overfill to form planar surface 109 can be performed by any process known in the art, such as chemical mechanical planarization (CMP) or etchback. An etchback technique that may advantageously be used is described in Raghuram et al., U.S. application Ser. No. 10/883,417, "Nonselective Unpatterned Etchback to Expose Buried Patterned Features," filed Jun. 30, 2004 and hereby incorporated by reference. At this stage, a plurality of substantially parallel first conductors have been formed at a first height above substrate 100.

Figure 9B:
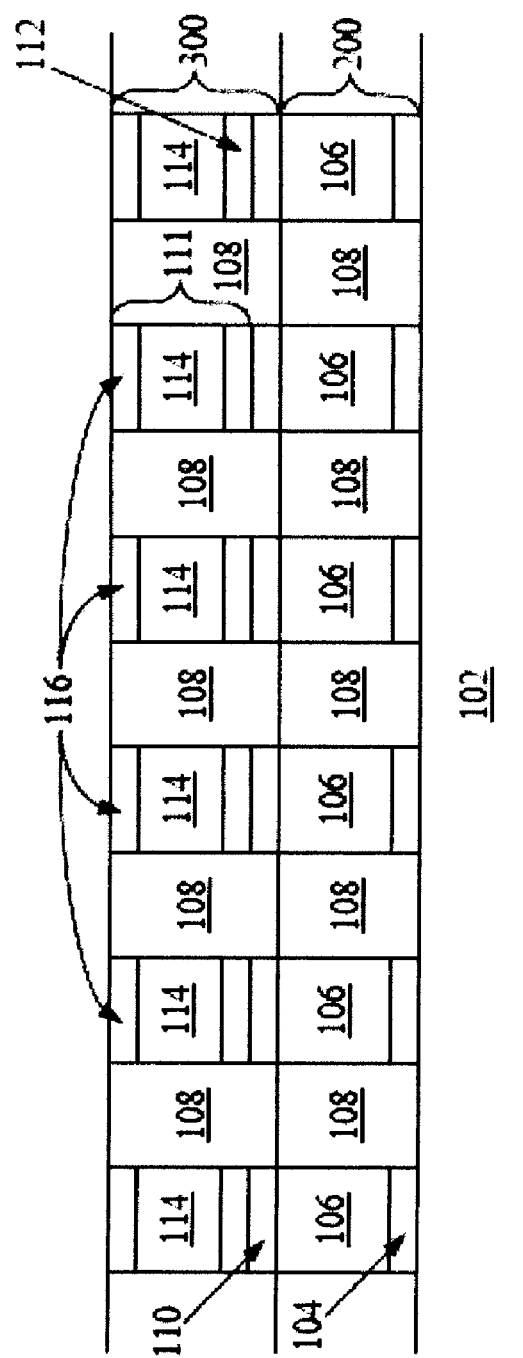

Next, turning to FIG. 9b, vertical pillars will be formed above completed conductor rails 200. (To save space substrate 100 is not shown in FIG. 9b; its presence will be assumed.) Preferably a barrier layer 110 is deposited as the first layer after planarization of the conductor rails. Any suitable material can be used in the barrier layer, including tungsten nitride, tantalum nitride, titanium nitride, or combinations of these materials. In a preferred embodiment, titanium nitride is used as the barrier layer. Where the barrier layer is titanium nitride, it can be deposited in the same manner as the adhesion layer described earlier.

Next semiconductor material that will be patterned into pillars is deposited. The semiconductor material can be silicon, germanium, a silicon-germanium alloy, or other suitable semiconductors, or semiconductor alloys. For simplicity, this description will refer to the semiconductor material as silicon, but it will be understood that the skilled practitioner may select any of these other suitable materials instead. Preferably, the semiconductor material is deposited in a relatively highly resistive amorphous or polycrystalline (which includes microcrystalline) state.

In preferred embodiments, the pillar comprises a semiconductor junction diode. The term junction diode is used herein to refer to a semiconductor device with the property of non-ohmic conduction, having two terminal electrodes, and made of semiconducting material which is p-type at one electrode and n-type at the other. Examples include p-n diodes and n-p diodes, which have p-type semiconductor material and n-type semiconductor material in contact, such as Zener diodes, and p-i-n diodes, in which intrinsic (undoped) semiconductor material is interposed between p-type semiconductor material and n-type semiconductor material.

Bottom heavily doped region 112 can be formed by any deposition and doping method known in the art. The silicon can be deposited and then doped, but is preferably doped in situ by flowing a donor gas providing n-type dopant atoms, for example phosphorus, during deposition of the silicon. Heavily doped region 112 is preferably between about 10 and about 80 nm thick.

Intrinsic layer 114 can be formed by any method known in the art. Layer 114 can be silicon, germanium, or any alloy of silicon or germanium and has a thickness between about 110 and about 330 nm, preferably about 200 nm.

Returning to FIG. 9b, semiconductor layers 114 and 112 just deposited, along with underlying barrier layer 110, will be patterned and etched to form pillars 300. Pillars 300 should have about the same pitch and about the same width as conductors 200 below, such that each pillar 300 is formed on top of a conductor 200. Some misalignment can be tolerated.

The pillars 300 can be formed using any suitable masking and etching process. For example, photoresist can be deposited, patterned using standard photolithography techniques, and etched, then the photoresist removed. Alternatively, a hard mask of some other material, for example silicon dioxide, can be formed on top of the semiconductor layer stack, with bottom antireflective coating (BARC) on top, then patterned and etched. Similarly, dielectric antireflective coating (DARC) can be used as a hard mask.

The photolithography techniques described in Chen, U.S. application Ser. No. 10/728,436, "Photomask Features with Interior Nonprinting Window Using Alternating Phase Shifting," filed Dec. 5, 2003; or Chen, U.S. application Ser. No. 10/815,312, Photomask Features with Chromeless Nonprinting Phase Shifting Window," filed Apr. 1, 2004, both owned by the assignee of the present invention and hereby incorporated by reference, can advantageously be used to perform any photolithography step used in formation of a memory array according to the present invention.

The pitch and width of the pillars 300 can be varied as desired. In one preferred embodiment, the pitch of the pillars (the distance from the center of one pillar to the center of the next pillar) is about 300 nm, while the width of a pillar varies between about 100 and about 150 nm. In another preferred embodiment, the pitch of the pillars is about 260 nm, while the width of a pillar varies between about 90 and 130 nm. In general, the pillars preferably have a substantially cylindrical shape with a circular or roughly circular cross section having a diameter of 250 nm or less. A "substantially cylindrical" element is one with a cross section which is roughly circular; more specifically, a cross section in which no portion of the perimeter is a straight edge for a length longer than fifty percent of the longest dimension measured through the centroid of the cross-sectional area. Clearly, a straight edge will not be "straight" to a molecular level, and may have minute irregularities; what is relevant is the degree of rounding, as described in U.S. Pat. No. 6,952,030, incorporated herein by reference.

Dielectric material 108 is deposited over and between the semiconductor pillars 300, filling the gaps between them. Dielectric material 108 can be any known electrically insulating material, such as silicon oxide, silicon nitride, or silicon oxynitride. In a preferred embodiment, silicon dioxide is used as the insulating material.

Next the dielectric material on top of the pillars 300 is removed, exposing the tops of pillars 300 separated by dielectric material 108, and leaving a substantially planar surface. This removal of dielectric overfill can be performed by any process known in the art, such as CMP or etchback. The insulating layer 108 is planarized such that it surrounds the semiconductor region of the pillar 300. After CMP or etchback, ion implantation is performed, forming heavily doped p-type top region 116. The p-type dopant is preferably boron or $BF_2$. This implant step completes formation of diodes 111. Alternatively, region 116 may be deposited as a layer on layer 114 before the pillar patterning step rather than being implanted into layer 114. The resulting structure is shown in FIG. 9b and schematically in FIG. 10a.

Figure 10A:
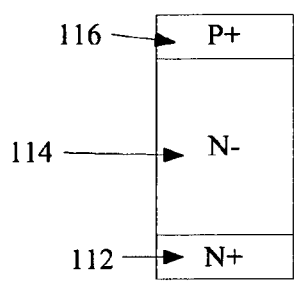
FIGS. 10a-10d are schematic side cross-sectional views illustrating alternative diode configurations according to an embodiment of the present invention.
Figure 10B:
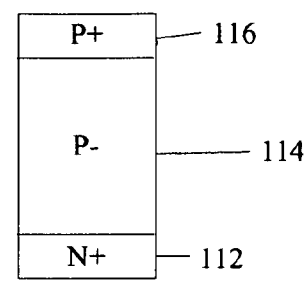
Figure 10C:
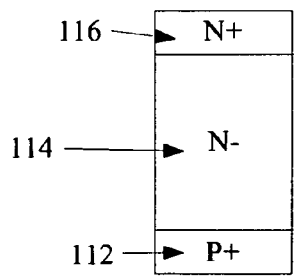
Figure 10D:
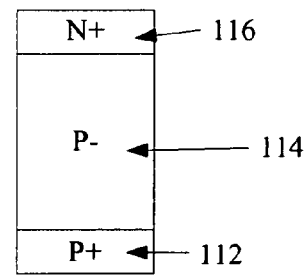

FIGS. 10b to 10d illustrate other permutations of diode structures. In the diodes of FIGS. 10a and 10b, bottom region 112 is N+ (heavily doped n-type silicon), and top region 116 is P+. In the diodes of FIGS. 10c and 10d, bottom region 112 is P+ and top region 116 is N+. In FIGS. 10a and 10c, middle region 114 is N−, while in FIGS. 5b and 5d, middle region 114 is P−. The middle region can intentionally be lightly doped, or it can be intrinsic, or not intentionally doped. An undoped region will never be perfectly electrically neutral, and will always have defects or contaminants that cause it to behave as if slightly n-doped or p-doped. Such a diode can be considered a p-i-n diode. Thus, a P+/N−/N+, P+/P−/N+, N+/N−/P+ or N+/P−/P+ diode can be formed.

Figure 9C:
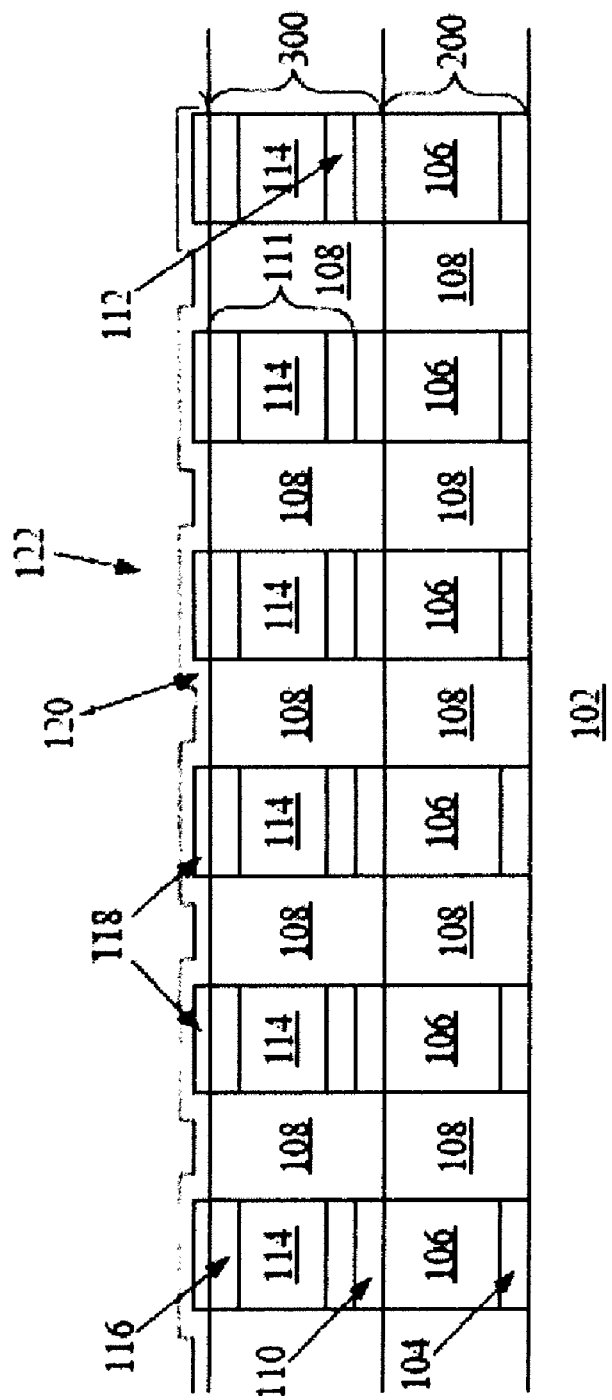

Turning to FIG. 9c, next an optional insulating oxide, nitride, or oxynitride layer 118 may be formed on heavily doped regions 116. Layer 118 will be reduced during formation of a titanium silicide layer 124 (but generally not other metal silicide layers), as will be described below. Alternatively, layer 118 may be omitted. For example, the optional silicon dioxide layer 118 is grown by oxidizing silicon at the tops of heavily doped regions 116 at about 600 to about 850° C. for about 20 seconds to about two minutes, forming between about 1 and about 5 nm of silicon dioxide. Preferably, oxide layer 118 is formed by exposing the wafer to about 800 degrees for about one minute in an oxygen-containing ambient. Layer 118 could be deposited instead.

Next, a layer 120 of a silicide-forming metal is deposited. Preferred silicide-forming metals to be used for this purpose include titanium or cobalt. This example will describe the use of titanium for layer 120, but it will be understood that other materials can be used.

Titanium layer 120 is deposited to any suitable thickness, for example between about 1 and about 20 nm, preferably between about 10 and about 15 nm, most preferably about 10 nm. To prevent oxidation of titanium layer 120, titanium nitride layer 122 is deposited, preferably about 30 nm thick. Layers 120 and 122 can be deposited by any conventional method, for example by sputtering.

An anneal is performed between about 600 and about 800° C. from about 10 seconds to about two minutes, preferably between about 650 degrees and about 750 degrees, most preferably at about 670 degrees for about 20 seconds, for example in nitrogen. The anneal serves to reduce oxide layer 118 and to react titanium layer 120 with heavily doped regions 116 where it overlies them to form titanium silicide. Oxide layer 118 is substantially entirely reduced between titanium layer 120 and the silicon of heavily doped region 116. If oxide layer 118 was deposited rather than grown, the rest of oxide layer 118 (between the tops of semiconductor pillars 300, overlying dielectric fill 108) would remain.

Figure 9D:
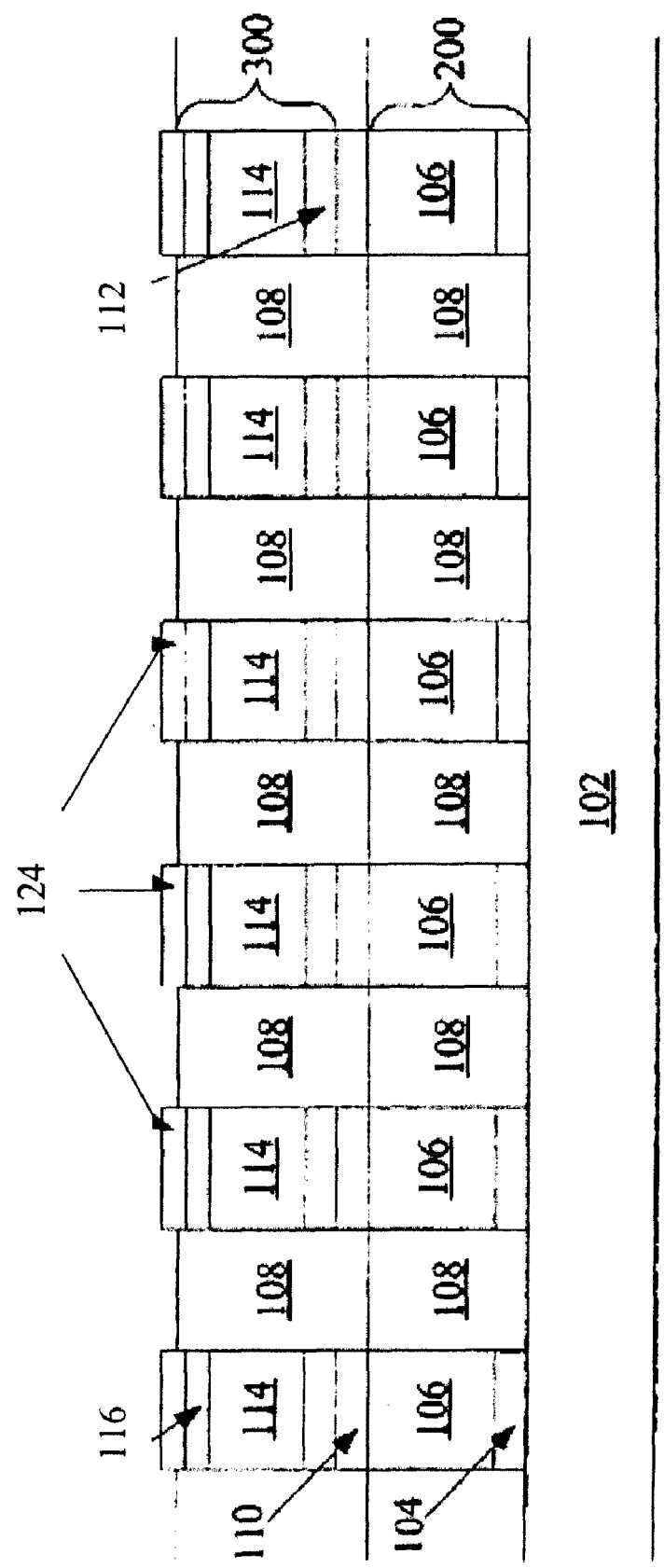

As in a conventional salicide process, titanium nitride layer 122 and unreacted titanium are stripped in a selective wet etch, leaving behind titanium silicide layers 124, each formed in a disk-shaped region on the top of one of the junction diodes, shown in FIG. 9d.

In a preferred embodiment, the titanium silicide feature 124 that is formed during the anneal comprises C49 phase titanium silicide. The C49 phase can be obtained if the annealing temperature is maintained below 700 degrees C. for large or small sized silicon features or if the annealing temperature is maintained above 700 degrees C., but the silicon feature size is 0.25 microns or less. Thus, the diameter of the diode 2 is preferably 0.25 microns or less to form the C49 phase of titanium silicide for annealing temperature above 700 degrees C. This phase is desired due to its lattice match with amorphous silicon during the crystallization process. In contrast larger features (greater than a dimensional size of 0.25 microns) will allow the titanium silicide to end as the C54 phase of titanium silicide during subsequent annealing above 700 degrees C. Even though the C54 phase provides low resistivity (which is highly desired by integrated circuit manufactures), it does not provide as good a lattice match during the crystallization process of the amorphous or polycrystalline silicon. Thus, the C49 phase titanium silicide allows for the greatest enhancement to grain growth and thus a lower diode resistivity by acting as a crystallization template for the semiconductor material of the diode.

As noted, in this example it is assumed that titanium is used in the silicide-forming metal layer 120, but other materials, including cobalt, could have been used instead. Thus, the titanium silicide layer 124 could instead be some other silicide, such as cobalt silicide.

At this point a plurality of first pillars has been formed above the first conductors, each pillar comprising a silicide layer 124.

In preferred embodiments, the junction diode is amorphous silicon as deposited, and is crystallized to form large grain, low resistivity polysilicon in contact with a silicide layer 124. The crystallization can occur during the formation of the silicide 124 and/or during a separate crystallization anneal after the memory cell is completed. The separate crystallization anneal may be conducted at a temperature above about 600° C., such as 650 to 850° C. for 1 or more minutes, such as 2 minutes to 24 hours, depending on the desired degree of crystallization. A lower temperature may be used for germanium and silicon germanium diode materials. The silicide layer 124 is advantageous for reducing the impedance of the junction diode, but may not be desired in the finished device. In an alternative embodiment, following formation of the silicide layer on the junction diode, the silicide layer can be removed.

FIG. 11 illustrates a completed memory cell. Top conductors 400 (i.e., the upper electrode 16 shown in FIG. 2) can be formed in the same manner as bottom conductors 200, for example by depositing adhesion layer 420, preferably of titanium nitride, and conductive layer 422, preferably of tungsten. Conductive layer 422 and adhesion layer 420 are then patterned and etched using any suitable masking and etching technique to form substantially parallel, substantially coplanar conductors 400, shown in FIG. 11 extending perpendicular to conductors 200. In a preferred embodiment, photoresist is deposited, patterned by photolithography and the layers etched, and then the photoresist removed using standard process techniques.

Next a dielectric material (not shown) is deposited over and between conductor rails 400. The dielectric material can be any known electrically insulating material, such as silicon oxide, silicon nitride, or silicon oxynitride. In a preferred embodiment, silicon oxide is used as this dielectric material.

Formation of a first memory level has been described. Additional memory levels can be formed above this first memory level to form a monolithic three dimensional memory array. In some embodiments, conductors can be shared between memory levels; i.e. top conductor 400 would serve as the bottom conductor of the next memory level. In other embodiments, an interlevel dielectric (not shown) is formed above the first memory level of FIG. 11, its surface planarized, and construction of a second memory level begins on this planarized interlevel dielectric, with no shared conductors.

A monolithic three dimensional memory array is one in which multiple memory levels are formed above a single substrate, such as a wafer, with no intervening substrates. The layers forming one memory level are deposited or grown directly over the layers of an existing level or levels. In contrast, stacked memories have been constructed by forming memory levels on separate substrates and adhering the memory levels atop each other, as in Leedy, U.S. Pat. No. 5,915,167, "Three dimensional structure memory." The substrates may be thinned or removed from the memory levels before bonding, but as the memory levels are initially formed over separate substrates, such memories are not true monolithic three dimensional memory arrays.

Monolithic three dimensional memory arrays are described in Johnson et al., U.S. Pat. No. 6,034,882, "Vertically stacked field programmable nonvolatile memory and method of fabrication"; Johnson, U.S. Pat. No. 6,525,953, "Vertically stacked field programmable nonvolatile memory and method of fabrication"; Knall et al., U.S. Pat. No. 6,420,215, "Three Dimensional Memory Array and Method of Fabrication"; Herner, U.S. application Ser. No. 10/095,962, "Silicide-Silicon Oxide-Semiconductor Antifuse Device and Method of Making," filed Mar. 13, 2002; Vyvoda et al., U.S. patent application Ser. No. 10/185,507, "Electrically Isolated Pillars in Active Devices," filed Jun. 27, 2002; Vyvoda, U.S. patent application Ser. No. 10/440,882, "Rail Schottky Device and Method of Making", filed May 19, 2003; and Cleeves et al., "Optimization of Critical Dimensions and Pitch of Patterned Features in and Above a Substrate," U.S. patent application Ser. No. 10/728,451, filed Dec. 5, 2003, all assigned to the assignee of the present invention and hereby incorporated by reference.

The present invention has been described herein in the context of a monolithic three dimensional memory array formed above a substrate. Such an array comprises at least a first memory level formed at a first height above the substrate and a second memory level formed at a second height different from the first height. Three, four, eight, or more memory levels can be formed above the substrate in such a multilevel array. Each memory level is monolithically formed on the memory level below it.

The memory cell of the present invention has been described as formed in a monolithic three dimensional memory array having stacked memory levels, but such cells could clearly be formed in a two-dimensional array, as well. The example given showed the silicide layer formed above the junction diode, but those skilled in the art will appreciate that the silicide layer can be formed elsewhere: beside the junction diode or below it, for example. Many configurations can be imagined.

In embodiments described herein, such as in the detailed example, a silicide layer is formed only on the semiconductor pillar. Embodiments can be envisioned, however, in which a silicide layer extends the entire length of one or both electrodes.

An alternative method for forming a similar array in which conductors are formed using Damascene construction is described in Radigan et al., U.S. patent application Ser. No. 11/444,936, "Conductive Hard Mask to Protect Patterned Features During Trench Etch," filed May 31, 2006, assigned to the assignee of the present invention and hereby incorporated by reference. The methods of Radigan et al. may be used instead to form an array according to the present invention.

The foregoing detailed description has described only a few of the many forms that this invention can take. For this reason, this detailed description is intended by way of illustration, and not by way of limitation. It is only the following claims, including all equivalents, which are intended to define the scope of this invention.

What is claimed is:

1. A method of making a diode, comprising:
forming a first electrode; forming a semiconductor region in electrical contact with the first electrode, wherein the semiconductor region comprises a p-n or a p-i-n junction in at least one silicon, germanium or silicon-germanium layer; forming a titanium layer on the semiconductor region; forming a titanium nitride layer on the titanium layer; reacting the titanium layer with the semiconductor region to form a titanium silicide, titanium germanide, or titanium silicide-germanide layer on the semiconductor region; removing the titanium nitride layer and a remaining portion of the titanium layer after the step of reacting; and forming a second electrode in electrical contact with the titanium silicide, titanium germanide or titanium silicide-germanide layer; wherein the titanium silicide, titanium germanide or titanium silicide-germanide layer comprises a C49 phase titanium silicide, a C49 phase titanium germanide or a C49 phase titanium silicide-germanide layer.

2. The method of claim 1, wherein the step of forming the semiconductor region comprises:
depositing a first silicon, germanium or silicon-germanium layer of a first conductivity type over the first electrode;
forming a second intrinsic silicon, germanium or silicon-germanium layer on the first layer; and
implanting dopants of a second conductivity type into the second layer to form a third layer of a second conductivity type opposite to the first conductivity type to form a p-i-n diode.

3. The method of claim 1, wherein: the least one silicon, germanium or silicon-germanium layer comprises the silicon layer; and the titanium silicide, titanium germanide or titanium silicide-germanide layer comprises the C49 phase titanium silicide layer.

4. The method of claim 1, wherein: the least one silicon, germanium or silicon-germanium layer comprises the germanium layer; and the titanium silicide, titanium germanide or titanium silicide-germanide layer comprises the C49 phase titanium germanide layer.

5. The method of claim 1, wherein: the least one silicon, germanium or silicon-germanium layer comprises the silicon-germanium layer; and the titanium silicide, titanium germanide or titanium silicide-germanide layer comprises the C49 phase titanium silicide-germanide layer.

6. The method of claim 1, further comprising patterning the semiconductor region such that the semiconductor region has a substantially cylindrical shape.

7. The method of claim 6, further comprising:
forming an insulating layer over the substantially cylindrical semiconductor region prior to the step of reacting; and
planarizing the insulating layer such that it surrounds the semiconductor region.

8. The method of claim 1, wherein:
the step of forming the semiconductor region comprises forming an amorphous or polycrystalline semiconductor region; and
further comprising crystallizing the semiconductor region to form a low resistivity polycrystalline semiconductor region using the titanium silicide, titanium germanide or titanium silicide-germanide layer as a crystallization template.

9. The method of claim 1, wherein the first electrode, the diode and the second electrode form a complete memory cell of a memory device.

10. The method of claim 9, wherein the diode comprises a p-i-n diode which is fabricated in a stable low resistivity, programmed state corresponding to a first memory state of the memory cell without performing an electrical programming step.

11. The method of claim 9, wherein the diode is fabricated in the low resistivity programmed state by crystallizing an amorphous or polycrystalline semiconductor region.

12. The method of claim 11, wherein the step of crystallizing comprises annealing the diode while using the titanium silicide, titanium germanide or titanium silicide-germanide layer comprising the C49 phase as a crystallization template.

13. The method of claim 10, further comprising:
applying a reverse bias greater than a predetermined critical voltage value to the diode to switch the diode to a stable high resistivity, unprogrammed state corresponding to a second memory state of the memory cell; and
applying a forward bias to the diode to switch the diode to the low resistivity, programmed state.

14. The method of claim 1, further comprising monolithically forming at least one additional device level over the diode.

15. A method of making a nonvolatile memory device comprising at least one memory cell which consists essentially of a diode and electrically conductive electrodes contacting the diode, the method comprising:
fabricating the diode in a stable low resistivity, programmed state corresponding to a first memory state of the memory cell without an electrical programming step,
wherein the step of fabricating the diode in the stable low resistivity, programmed state comprises:
forming a high resistivity amorphous or polycrystalline silicon, germanium or silicon-germanium diode;
forming a C49 phase titanium silicide, C49 phase titanium germanide or C49 phase titanium silicide-germanide layer in contact with the high resistivity diode; and
crystallizing the amorphous or polycrystalline diode to the low resistivity state using the titanium silicide, titanium germanide or titanium silicide-germanide layer as a crystallization template.

16. The method of claim 15, further comprising:
applying a reverse bias greater than a predetermined critical voltage value to the diode to switch the diode to a stable high resistivity, unprogrammed state corresponding to a second memory state of the memory cell; and
applying a forward bias to the diode to switch the diode to the low resistivity, programmed state.

17. The method of claim 15, further comprising monolithically forming at least one additional memory device level over the memory cell.

18. A method of operating a diode memory cell, comprising:
providing the diode which is fabricated in a stable low resistivity, programmed state corresponding to a first memory state of the memory cell without an electrical programming step;
applying a reverse bias greater than a predetermined critical voltage value to the diode to switch the diode to a high resistivity, unprogrammed state corresponding to a second memory state of the memory cell; and
applying a forward bias to the diode to switch the diode to the low resistivity, programmed state;
wherein the step of providing the diode which is fabricated in the stable low resistivity programmed state comprises:
forming a high resistivity amorphous or polycrystalline silicon, germanium or silicon-germanium diode;
forming a C49 phase titanium silicide, C49 phase titanium germanide or C49 phase titanium silicide-germanide layer in contact with the high resistivity diode; and
crystallizing the amorphous or polycrystalline diode to the low resistivity state using the titanium silicide, titanium germanide or titanium silicide-germanide layer as a crystallization template.

19. The method of claim 18, wherein the diode comprises a polycrystalline semiconductor p-i-n diode.

20. The method of claim 18, wherein the memory cell consists essentially of the diode and electrically conductive electrodes contacting the diode.

21. The method of claim 20, further comprising sensing a resistivity state of the diode as a data state of the memory cell.

* * * * *